(12) United States Patent
Okada

(10) Patent No.: US 8,723,702 B2
(45) Date of Patent: May 13, 2014

(54) DATA TRANSFER METHOD, AND CODE CONVERSION CIRCUIT AND APPARATUS

(75) Inventor: Seishi Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 261 days.

(21) Appl. No.: 13/312,462

(22) Filed: Dec. 6, 2011

(65) Prior Publication Data

US 2012/0075127 A1 Mar. 29, 2012

Related U.S. Application Data

(63) Continuation of application No. PCT/JP2009/061235, filed on Jun. 19, 2009.

(51) Int. Cl.
*H03M 5/00* (2006.01)

(52) U.S. Cl.
USPC ............... 341/55; 341/56; 341/58; 341/102; 341/103

(58) Field of Classification Search
USPC ...................... 341/58, 61, 100–103, 55, 56
See application file for complete search history.

(56) References Cited

U.S. PATENT DOCUMENTS

| | | | |
|---|---|---|---|
| 4,486,739 A | 12/1984 | Franaszek et al. | |
| 5,412,783 A | 5/1995 | Skokan | |
| 5,574,849 A | 11/1996 | Sonnier et al. | |
| 5,930,399 A * | 7/1999 | Kadyk et al. | 382/245 |
| 6,181,821 B1 * | 1/2001 | Lim | 382/232 |
| 6,275,587 B1 * | 8/2001 | Amerige | 380/255 |
| 6,385,319 B1 | 5/2002 | Nyu | |
| 6,484,167 B1 * | 11/2002 | Tarlano | 1/1 |
| 6,867,713 B2 * | 3/2005 | Tsang | 341/58 |
| 6,915,352 B2 * | 7/2005 | Ho et al. | 709/246 |
| 7,061,407 B1 * | 6/2006 | Lee | 341/50 |
| 2002/0122433 A1 | 9/2002 | Pelley et al. | |
| 2003/0095057 A1 * | 5/2003 | Gredone et al. | 341/100 |
| 2006/0013293 A1 | 1/2006 | Hirsch | |
| 2007/0101241 A1 * | 5/2007 | Hoyer | 714/776 |
| 2008/0033974 A1 * | 2/2008 | Cameron | 707/101 |
| 2009/0119571 A1 * | 5/2009 | Hoyer | 714/807 |
| 2010/0149137 A1 * | 6/2010 | Saito | 345/204 |

FOREIGN PATENT DOCUMENTS

| | | |
|---|---|---|
| JP | 59-10056 | 1/1984 |
| JP | 60-130236 | 7/1985 |
| JP | 5-336193 | 12/1993 |

(Continued)

OTHER PUBLICATIONS

International Search Report for PCT/JP2009/061235, mailed Aug. 25, 2009.

(Continued)

*Primary Examiner* — Linh Nguyen
(74) *Attorney, Agent, or Firm* — Staas & Halsey LLP

(57) ABSTRACT

A data transfer method multiplexes a data character having a bit width M (M is a natural number greater than or equal to 3) and a control character having a bit width N (N is a natural number greater than or equal to 1), and adds a control character valid signal indicating whether the control character is valid, in order to generate a symbol code having a bit width M+1 or N+3, whichever is greater, and converts the symbol code from parallel data into serial data to be output to a transmission line.

10 Claims, 18 Drawing Sheets

(56) References Cited

FOREIGN PATENT DOCUMENTS

| | | |
|---|---|---|
| JP | 11-177439 | 7/1999 |
| JP | 2002-280991 | 9/2002 |
| JP | 2004-080300 | 3/2004 |
| JP | 2006-502679 | 1/2006 |
| JP | 2006-250824 | 9/2006 |
| JP | 2007-32526 | 2/2007 |
| WO | 2007/047733 | 4/2007 |

OTHER PUBLICATIONS

"PCI Express Base Specification Revision 2.0", Dec. 20, 2006.
Japanese Office Action issued May 28, 2013 in corresponding Japanese Patent Application No. 2011-519392.
Espacenet English Abstract of Japanese Publication No. 11-177439, Published Jul. 2, 1999.
Extended European Search Report issued Oct. 16, 2012 in corresponding European Patent Application No. 09846208.8.

* cited by examiner

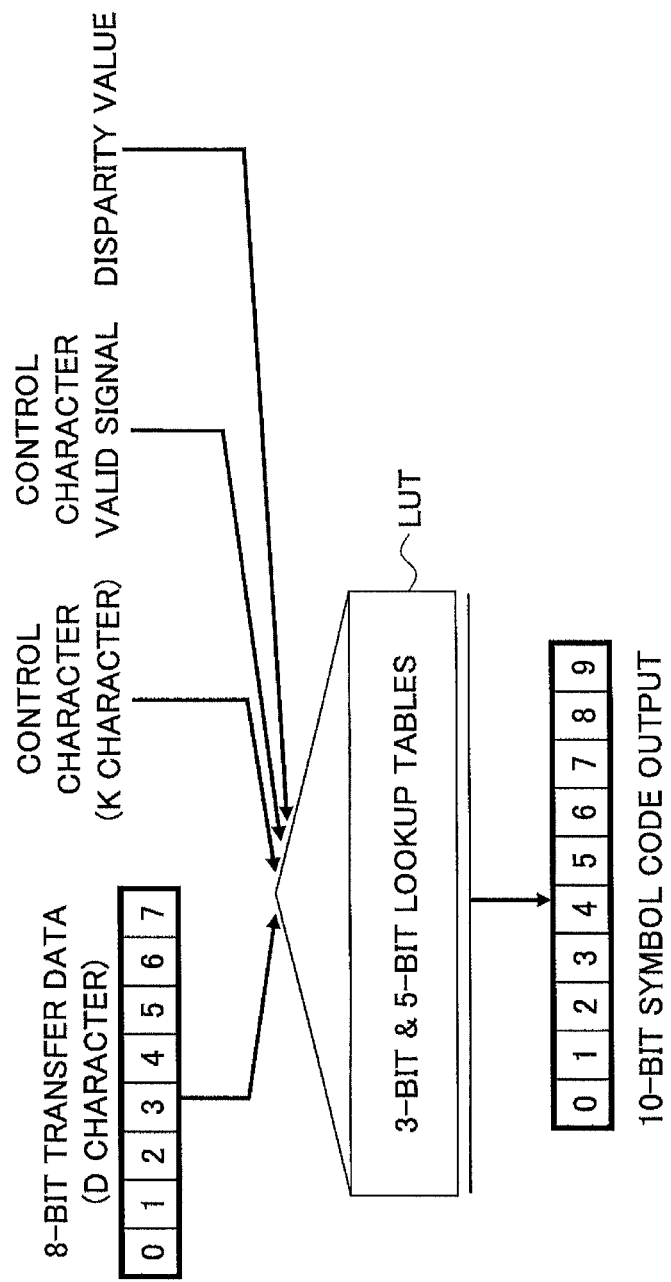

FIG.2

| CODE | SYMBOL | NAME | MEANING |
|---|---|---|---|
| K28.5 | COM | Comma | Initialization & management of lane & link |
| K28.7 | STP | Start TLP | Start transaction layer packet |
| K28.2 | SDP | Start DLLP | Start data link layer packet |
| K29.7 | END | End | End of packet |
| K30.7 | EDB | End Bad | End of invalid packet |
| K23.7 | PAD | Pad | Fill when valid data may not be inserted due to link rule |
| K28.0 | SKP | Skip | Adjust clock jitter on transmitting end or receiving end |
| K28.1 | FTS | Fast Training Sequence | Used in specific order set. |
|  |  |  | Used for transition to L0 by escaping from L0s |
| K28.3 | IDL | Idle | Used in electrical idle order set |
| K28.4 | – | – | Spare |
| K28.6 | – | – | Spare |
| K28.7 | – | – | Spare |

FIG.5

MEANING OF 10-BIT SYMBOL CODE

| Cntl | S_Bit0 | MEANING |
|---|---|---|
| 1 | 0 | Symbol is D character. Value of Bit0 of D character is "0". S_Bit1~8 indicates value of D_Bit1~8 of D character. |
| 0 | 1 | Symbol is D character. Value of Bit0 of D character is "1". S_Bit1~8 indicates value of D_Bit1~8 of D character. |
| 1 | 1 | Symbol is K character. Code represented by S_Bit2~8 (maximum of 128 kinds). S_Bit1 is an inverted value of S_Bit2. |
| 0 | 0 | Invalid symbol. |

FIG.6

| NAME OF CONTROL CHARACTER | 10-BIT SYMBOL CODE Cntl, S_Bit0~S_Bit8 |
|---|---|
| Control Character 1 | 11_1_0000000 |
| Control Character 2 | 11_1_0000001 |
| Control Character 3 | 11_1_0000010 |
| Control Character 4 | 11_1_0000011 |
| Control Character 5 | 11_1_0000100 |
| Control Character 6 | 11_1_0000101 |
| Control Character 7 | 11_1_0000110 |
| Control Character 8 | 11_1_0000111 |
| Control Character 9 | 11_1_0001000 |
| Control Character 10 | 11_1_0001001 |
| Control Character 11 | 11_1_0001010 |
| Control Character 12 | 11_1_0001011 |
| ... | ... |
| Control Character 126 | 11_0_1111101 |
| Control Character 127 | 11_0_1111110 |
| Control Character 128 | 11_0_1111111 |

FIG.7

| NAME OF CONTROL CHARACTER | 10-BIT SYMBOL CODE Cntl, S_Bit0~S_Bit8 |
|---|---|
| Control Character 1 | 11_01_01_01_01 |
| Control Character 2 | 11_01_01_01_10 |
| Control Character 3 | 11_01_01_10_01 |
| Control Character 4 | 11_01_01_10_10 |
| Control Character 5 | 11_01_10_01_01 |
| Control Character 6 | 11_01_10_01_10 |
| Control Character 7 | 11_01_10_10_01 |
| Control Character 8 | 11_01_10_10_10 |
| Control Character 9 | 11_10_01_01_01 |
| Control Character 10 | 11_10_01_01_10 |
| Control Character 11 | 11_10_01_10_01 |
| Control Character 12 | 11_10_01_10_10 |
| Control Character 13 | 11_10_10_01_01 |
| Control Character 14 | 11_10_10_01_10 |
| Control Character 15 | 11_10_10_10_01 |
| Control Character 16 | 11_10_10_10_10 |

FIG.12

| Kcode_ENBL_in | Cntl | Bit0 | Bit1 | Bit2 | Output Bit | | | | | |
|---|---|---|---|---|---|---|---|---|---|---|
| | | | | | Bit3 | Bit4 | Bit5 | Bit6 | Bit7 | Bit8 |
| ON | "1" | "1" | Kcode_in [0] | ^Kcode_in [0] | Kcode_in [1] | ^Kcode_in [1] | Kcode_in [2] | ^Kcode_in [2] | Kcode_in [3] | ^Kcode_in [3] |
| OFF | ^Dcode_in [0] | Dcode_in [0] | Dcode_in [1] | Dcode_in [2] | Dcode_in [3] | Dcode_in [4] | Dcode_in [5] | Dcode_in [6] | Dcode_in [7] | Dcode_in [8] |

FIG.15

| Cntl | Input Bit | | | | | | | | | | Dcode_ENBL_out | Kcode_ENBL_out | Symbol_ERROR_out |
|---|---|---|---|---|---|---|---|---|---|---|---|---|---|
| | Bit0 | Bit1 | Bit2 | Bit3 | Bit4 | Bit5 | Bit6 | Bit7 | Bit8 | | | |
| "0" | "0" | – | – | – | – | – | – | – | – | | OFF | OFF | ON |
| "0" | "1" | – | MATCH | | | | | | | | ON | OFF | OFF |
| "1" | "0" | – | | MATCH | | | | | | | ON | OFF | OFF |
| "1" | "1" | – | | | MATCH | | | | | | OFF | OFF | OFF |
| | | – | | | | MATCH | | | | | OFF | OFF | ON |
| | | – | | | | | MATCH | | | | OFF | OFF | ON |
| | | – | | | | | | MATCH | | | OFF | ON | ON |
| | | MISMATCH | MISMATCH | MISMATCH | MISMATCH | MISMATCH | MISMATCH | MISMATCH | | | OFF | OFF | OFF |

FIG.17

| SYMBOL CODE | SERIAL BUS NUMBER (LANE NUMBER) | | | | | | | |
|---|---|---|---|---|---|---|---|---|
| | #0 | #1 | #2 | #3 | #4 | #5 | #6 | #7 |
| Cntl | cntl | cntl | cntl | cntl | cntl | cntl | cntl | cntl |
| S_Bit0 | D00 | D09 | D18 | D27 | D36 | D45 | D54 | D63 |
| S_Bit1 | D01 | D10 | D19 | D28 | D37 | D46 | D55 | D64 |
| S_Bit2 | D02 | D11 | D20 | D29 | D38 | D47 | D56 | D65 |
| S_Bit3 | D03 | D12 | D21 | D30 | D39 | D48 | D57 | D66 |
| S_Bit4 | D04 | D13 | D22 | D31 | D40 | D49 | D58 | D67 |
| S_Bit5 | D05 | D14 | D23 | D32 | D41 | D50 | D59 | D68 |
| S_Bit6 | D06 | D15 | D24 | D33 | D42 | D51 | D60 | D69 |
| S_Bit7 | D07 | D16 | D25 | D34 | D43 | D52 | D61 | D70 |
| S_Bit8 | D08 | D17 | D26 | D35 | D44 | D53 | D62 | D71 |

FIG.18

| 72-BIT PARALLEL DATA BUS | Bit 0~7 | Bit 8~15 | Bit 16~23 | Bit 24~31 | Bit 32~39 | Bit 40~47 | Bit 48~55 | Bit 56~63 | Bit 64~71 |
|---|---|---|---|---|---|---|---|---|---|
| DEFINITION OF DATA | DATA Byte0 | DATA Byte1 | DATA Byte2 | DATA Byte3 | DATA Byte4 | DATA Byte5 | DATA Byte6 | DATA Byte7 | REDUNDANT BITS [0:7] |

DATA TRANSFER METHOD, AND CODE CONVERSION CIRCUIT AND APPARATUS

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2009/061235 filed on Jun. 19, 2009, in the Japanese Patent Office, the disclosure of which is hereby incorporated by reference.

FIELD

The present invention relates to data transfer methods, and code conversion circuits and apparatuses.

BACKGROUND

Conventionally, a relatively low-speed parallel data bus is used for information transfer between LSIs (Large Scale Integrated circuits) or, between apparatuses having LSIs. However, although the parallel data bus may couple the LSIs or the apparatuses in a simple manner, improving the information transfer capacity is difficult due to a skew generated among signals. Accordingly, in recent years, a relatively high-speed serial bus is used to couple the LSI or the apparatuses.

The PCI (Peripheral Component Interconnect) Express is a typical example of the high-speed serial transfer (for example, Japanese Laid-Open Patent Publication No. 59-10056). The PCI Express employs an encoding technique called the 8B10B encoding in order to enable a high-speed serial transfer. The 8B10B encoding is employed in Ethernet, Fiber Channel, IEEE 1394, and the like, in addition to being employed in the PCI Express.

Basically, the 8B10B encoding includes the following two features. First, 256 kinds of 8-bit data characters called D characters illustrated in FIGS. 1 and 12 kinds of control characters called K characters illustrated in FIG. 2 are multiplexed, in order to make a conversion to a 10-bit symbol code using a 3-bit lookup table LUT and a 5-bit lookup table LUT. FIG. 1 illustrates a case in which a 10-bit symbol code is output using the lookup tables LUT based on the 8-bit D characters, K characters, a control character valid signal, and a disparity value. FIG. 2 illustrates the code, symbol, name, and meaning of the K character. Second, because the 10-bit symbol is defined so that identical bit values only appear for 5 consecutive bits at the maximum, at least one transition of the bit value always occurs within 10-bit symbol, thereby making it easy to reproduce a clock on a receiving end apparatus. The transition of the bit value refers to a transition of the bit value from "0" to "1" or, from "1" to "0".

However, according to the conventional 8B10B encoding, the overhead at the time of the serial transfer is relatively large, and for this reason, a relatively large bandwidth of the serial bus is used up. More particularly, because the 8-bit data character is converted into 10 bits, the bandwidth increases by 25%.

In addition, according to the conventional 8B10B encoding, inconveniences are introduced due to the use of the lookup tables LUT for the data conversion. In other words, a delay time becomes relatively long due to a relatively large circuit scale associated with the lookup tables LUT that are used for the data conversion. More particularly, a 3-bit conversion table and a 5-bit conversion table are required for the conversion from 8 bits into 10 bits (or vice versa), and for this reason, the delay time becomes relatively long.

Moreover, in the conventional 8B10B encoding, the error resilience deteriorates because the 8-bit data is segmented into 3 bits and 5 bits and then converted into the 10-bit symbol using the lookup tables LUT. In other words, when a 1-bit error occurs in a transmission line or channel, a 4-bit error may be generated at the maximum when the 10-bit symbol is restored back into the 8-bit data.

FIG. 3 is a diagram, including a 8B10B code conversion circuit, for explaining a data flow in the serial bus. A transmitting end apparatus 1 converts the 8-bit parallel data into the 10-bit symbol code using a 8B10B code conversion circuit 2. The symbol code is transferred between the transmitting end apparatus 1 and a receiving end apparatus 3 via a serial bus 5. The receiving end apparatus 3 converts the 10-bit symbol code that is received into the 8-bit data by a 10B8B code conversion circuit 4 that performs a reverse procedure to that performed in the transmitting end apparatus 2.

It is assumed for the sake of convenience that the transmitting end data is "57" in hexadecimal ("010101112" in binary in FIG. 3). When this transmitting end data is the D character, the result of the conversion performed in the 8B10B conversion circuit 2 is "055" in hexadecimal ("0001010101" in binary in FIG. 3). In addition, when it is assumed that a 1-bit error occurs when the 10-bit symbol code is being transferred via the serial bus 5 forming the transmission line, and a transition to "255" in hexadecimal (transition from bit "0" to bit "1" in FIG. 3) occurs, the result of the conversion of the symbol code in the 10B8B code conversion circuit 4 on the receiving end apparatus 3 becomes "49" in hexadecimal ("01001001" in binary in FIG. 3). When the transmitting end data "01010111" in binary and the receiving end data "01001001" in binary are compared, it may be seen that 4 bits have made a transition. In other words, the 1-bit error on the serial bus 5 becomes a 4-bit error in the transmitting and receiving data, and the number of error bits increases.

According to the data transfer method employing the conventional 8B10B encoding, it may be difficult to reduce the overhead of the bus at the time of the serial transfer and to effectively utilize the bandwidth of the bus.

SUMMARY

Accordingly, it is an object in one aspect of the embodiment a data transfer method, and a code conversion circuit and apparatus which may reduce the overhead of the bus at the time of the serial transfer and effectively utilize the bandwidth of the bus.

According to one aspect of the present invention, a data transfer method may include multiplexing a data character having a bit width M (M is a natural number greater than or equal to 3) and a control character having a bit width N (N is a natural number greater than or equal to 1), and adding a control character valid signal indicating whether the control character is valid, in order to generate a symbol code having a bit width M+1 or N+3, whichever is greater; and making a data transfer by converting the symbol code from parallel data into serial data, and outputting the serial data to a transmission line.

According to one aspect of the present invention, a code conversion circuit may include a first circuit configured to multiplex a data character having a bit width M (M is a natural number greater than or equal to 3) and a control character having a bit width N (N is a natural number greater than or equal to 1); and a second circuit configured to add, to an output of the first circuit, a control character valid signal indicating whether the control character is valid, in order to generate a symbol code having a bit width M+1 or N+3, whichever is greater, wherein the symbol code is converted from parallel data into serial data and output to a transmission line.

According to one aspect of the present invention, an apparatus may include a code conversion circuit including a first circuit configured to multiplex a data character having a bit width M (M is a natural number greater than or equal to 3) and a control character having a bit width N (N is a natural number greater than or equal to 1), and a second circuit configured to add, to an output of the first circuit, a control character valid signal indicating whether the control character is valid, in order to generate a symbol code having a bit width M+1 or N+3, whichever is greater; and a conversion circuit configured to convert the symbol code from parallel data into serial data and to output the serial data to a transmission line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWING

FIG. 1 is a diagram for explaining D characters;

FIG. 2 is a diagram for explaining K characters;

FIG. 5 is a diagram for explaining an example of a definition of symbol codes;

FIG. 6 is a diagram for explaining an example of a definition of control characters;

FIG. 7 is a diagram for explaining another example of the definition of the control characters;

FIG. 12 is a diagram illustrating a truth table for explaining an operation of the transmitting end code conversion circuit;

FIG. 15 is a diagram illustrating a truth table for explaining an operation of the receiving end code conversion circuit;

FIG. 17 is a diagram for explaining an example of a bit allocation for each lane; and FIG. 18 is a diagram for explaining an example of a bit allocation for a 72-bit parallel data bus.

DESCRIPTION OF EMBODIMENTS

In order to realize a desired transfer efficiency (or transmission efficiency) when making a serial transfer that involves serial-to-parallel conversion in the data transfer method, and the code conversion circuit and apparatus disclosed herein, a control character valid signal which indicates whether a control character is valid with respect to the character being transferred (or transmitted) is added, and a data characters and a control character are multiplexed and transferred (or transmitted).

When transferring the data character, an inverted value of a predetermined bit of the data character is used as the bit value of the control character valid signal. When transferring the control character, the value of the predetermined bit of the data character and the bit value of the control character valid signal are set to the same value. The control character is represented by bits other than the bit value of the control character valid signal having the same value as the predetermined bit of the data character.

Accordingly, an AC transfer of the multiplexed code may be made efficiently, and the overhead of the bus at the time of the serial transfer may be reduced, to thereby enable efficient utilization of the bandwidth of the bus.

The AC transfer refers to a data transfer using a signal having an AC characteristic. The data having the AC characteristic and transferred via the transmission line or channel is independent of the data character that is transferred, and is guaranteed to always include the value "0" and the value "1" in the symbol code after the code conversion, and also to always include at least one transition of the bit value, even when all bits of the data character are constantly "0" (all "0"s), for example. In other words, when the data has the AC characteristic, it means that the data transferred via the transmission line has such an alternating current characteristic.

Next, a description will be given of each embodiment of the data transfer method, and the code conversion circuit and apparatus disclosed herein, by referring to the remaining figures.

Figure 3:
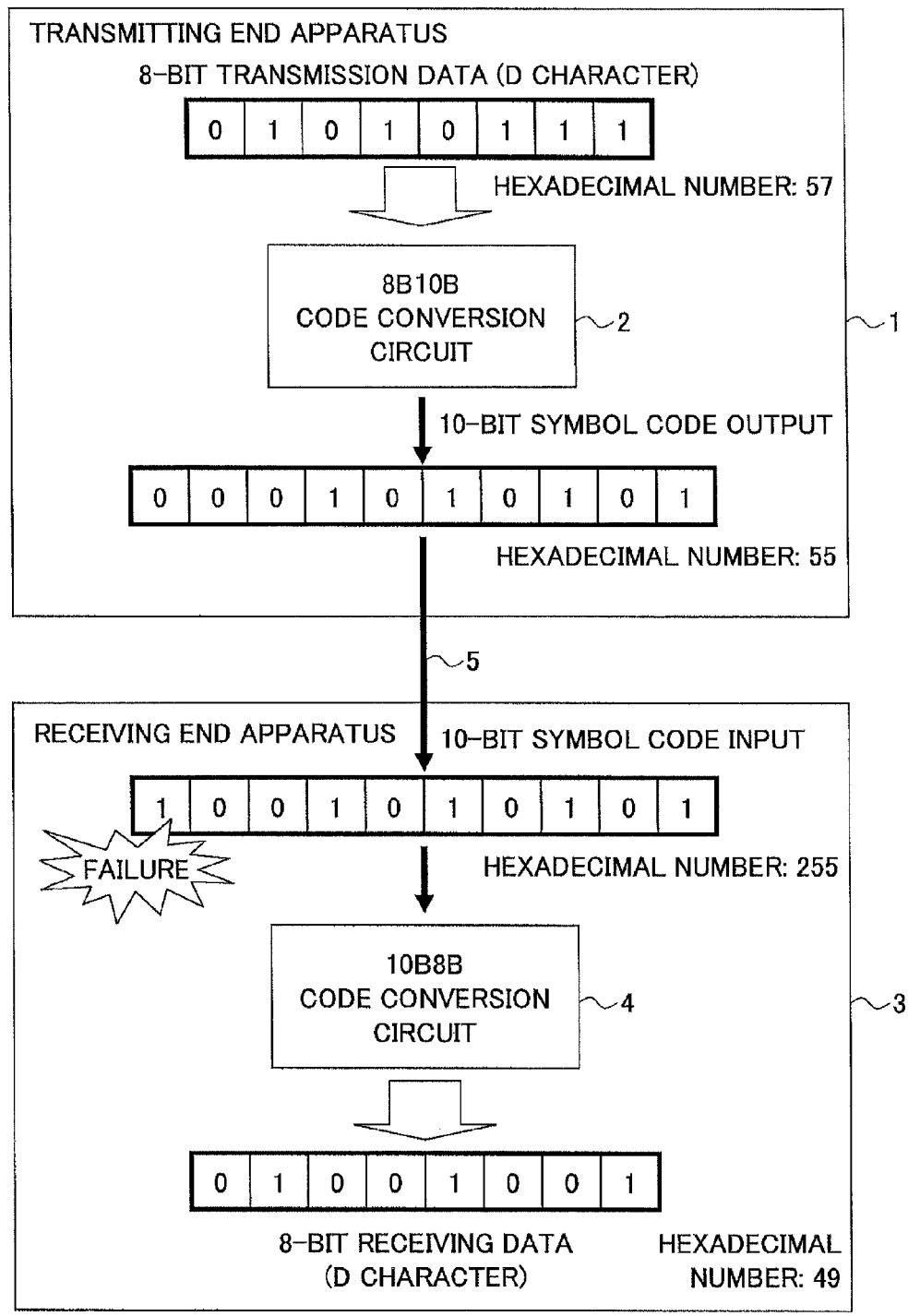
FIG. 3 is a diagram for explaining a data flow in a serial bus, including a 8B10B code conversion circuit.
Figure 4:
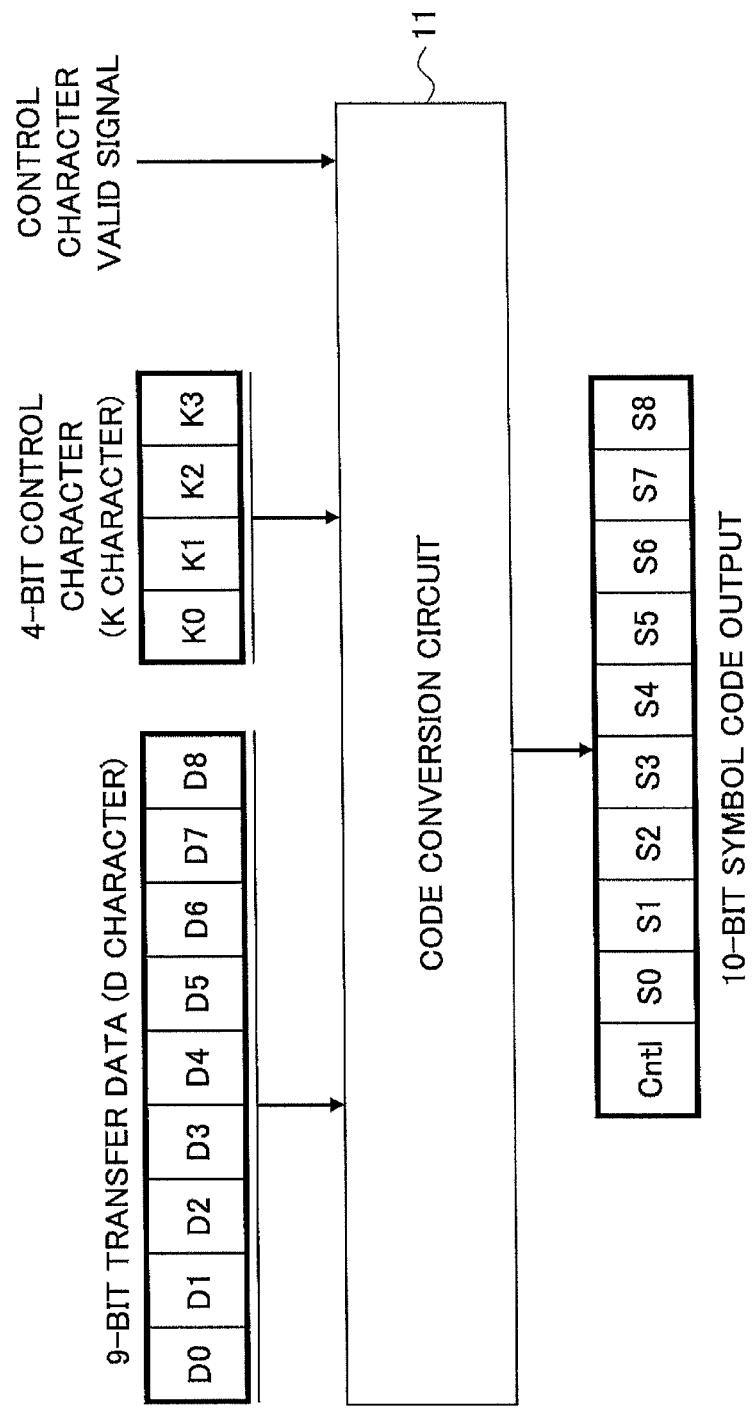
FIG. 4 is a diagram for explaining a code conversion circuit in an embodiment of the present invention.

FIG. 4 is a diagram for explaining the code conversion circuit in an embodiment of the present invention. Inputs to a code conversion circuit 11 illustrated in FIG. 4 include 9 bits D0 through D8 of the data character (D character), 4 bits K0 through K3 of the control character (K character), and the control character valid signal. Outputs from the code conversion circuit 11 include bits Cntl and S0 through S8 of a 10-bit symbol code. In the following description, a bit Bit0 of the D character may be represented as D0 or D_Bit0, a bit Bit0 of the K character may be represented as K0 or K_Bit0, and a bit Bit0 of the symbol code may be represented as S0 or S_Bit0.

FIG. 5 is a diagram for explaining an example of a definition of symbol codes. When the control bit Cntl is "1" and the bit S_Bit0 of the symbol code is "0", the symbol of the 10-bit symbol code is the D character. In this case, the value of the bit Bit0 of the D character is "0", and the value of the bits D_Bit1 through D_Bit8 of the D character is indicated by the bits S_Bit1 through S_Bit8. When the control bit Cntl is "0" and the bits_Bit0 of the symbol code is "1", the symbol of the 10-bit symbol code is the D character. In this case, the value of the bit Bit0 of the D character is "1", and the value of the bits D_Bit1 through D_Bit8 of the D character is indicated by the bits S_Bit1 through S_Bit8. When the control bit Cntl is "1" and the bit S_Bit0 of the symbol code is "1", the symbol of the 10-bit symbol code is the K character. In this case, a maximum of 128 kinds of codes may be represented by the bits S_Bit2 through S_Bit8, and the bit S_Bit1 indicates an inverted value of the bit S_Bit2. In addition, when the control bit Cntl is "0" and the bit S_Bit0 of the symbol code is "0", it is indicated that the code is an invalid symbol.

FIG. 6 is a diagram for explaining an example of a definition of control characters, and FIG. 7 is a diagram for explaining another example of the definition of the control characters. FIGS. 6 and 7 respectively illustrate the bits Cntl and S_Bit0 through S_Bit8 of the 10-bit symbol code corresponding to the name of each control character. FIG. 6 illustrates the symbol code of the control characters 1 through 128, and FIG. 7 illustrates the symbol code of the control characters 1 through 16. The control characters illustrated in FIG. 7 have an increased redundancy compared to the control characters illustrated in FIG. 6.

In FIGS. 4 through 7, it is assumed for the sake of convenience that the data character having the bit width (or bit length) of 9 bits and the control character having the bit width (or bit length) of 4 bits are transferred as an example. However, the bit width of the data character is not limited to 9 bits, and the bit width may be any integer value greater than or equal to 3 bits. When the bit width of the data character is denoted by M bit (M is a natural number greater than or equal to 3) and the bit width of the control character is denoted by N (N is a natural number greater than or equal to 1), the bit width of the symbol code may be M+1 bits or N+3 bits, whichever is greater.

In the examples illustrated in FIGS. 4 through 7, the 1-bit control bit Cntl is added with respect to the data character having the bit width of 9 bits. Hence, a single symbol code formed by the bits Cntl and S0 through S8 and transferred on the serial bus has the bit width of 10 bits. Furthermore, in the case of the example illustrated in FIG. 7, 12 or more kinds of control characters and a maximum of 16 kinds of control characters are transferred in a manner similar to the PCI Express specifications. On the other hand, in the case of the example illustrated in FIG. 6, 12 or more kinds of control characters and a maximum of 128 kinds of control characters are transferred.

When transferring the data character in the transmitting end apparatus, the inverted value of the predetermined bit D_Bit0 of the data character is used as the value of the control bit Cntl, as defined in FIG. 6. When transmitting the control character, the positions of the control bit Cntl and the predetermined bit D_Bit0 of the data character are set the same, and the control character is represented by the bits other than the predetermined bit D_Bit0. In FIG. 5, the values of the control bit Cntl and the bits_Bit0 of the symbol code are both set to "1" when transmitting the control character, however, the values of these two bits may of course be both set to "0". The inverted value of the bit K Bit of the control character is used as the value of the bit S_Bit1 of the symbol code, and 128 kinds of control characters may be represented by 7 bits S_Bit2 through S_Bit8.

In the case of the definition of the control characters illustrated in FIG. 6, a maximum of 128 kinds of control characters may be defined. When the number of kinds of control characters actually required is considerably less than 128 kinds, and only 12 kinds is required as in the case of the PCI Express, for example, redundant bits may be provided as in the case of the definition of the control characters illustrated in FIG. 7, in order to improve the error resilience.

FIG. 7 illustrates an example in which the 4-bit control character is assigned to the 10-bit symbol code. In the example illustrated in FIG. 7, the values of the control bit Cntl and the bit S_Bit0 of the symbol code are set to "1", the bits K_Bit0 through K_Bit3 of the control character are assigned to the bits S_Bit1, S_Bit3, S_Bit5 and S_Bit7 of the symbol code, and the inverted values of the bits S_Bit1, S_Bit3, S_Bit5 and S_Bit7 of the symbol code are respectively set as the values of the bits S_Bit2, S_Bit4, S_Bit6 and S_Bit8 of the symbol code.

On the other hand, in the receiving end apparatus, the values of the control bit Cntl and the bit S_Bit0 of the symbol code are compared according to FIG. 5. When the values do not match as a result of this comparison, the receiving end apparatus may recognize that the received symbol code is the data character, and output the bits S_Bit0 through S_Bit8 of the symbol code as the bits D_Bit0 through D_Bit8 of the data character. On the other hand, when the values match as a result of this comparison, and the values of the bits Cbtl and S_Bit0 are both "1", the receiving end apparatus may recognize that the received symbol code is the control character.

Figure 8:
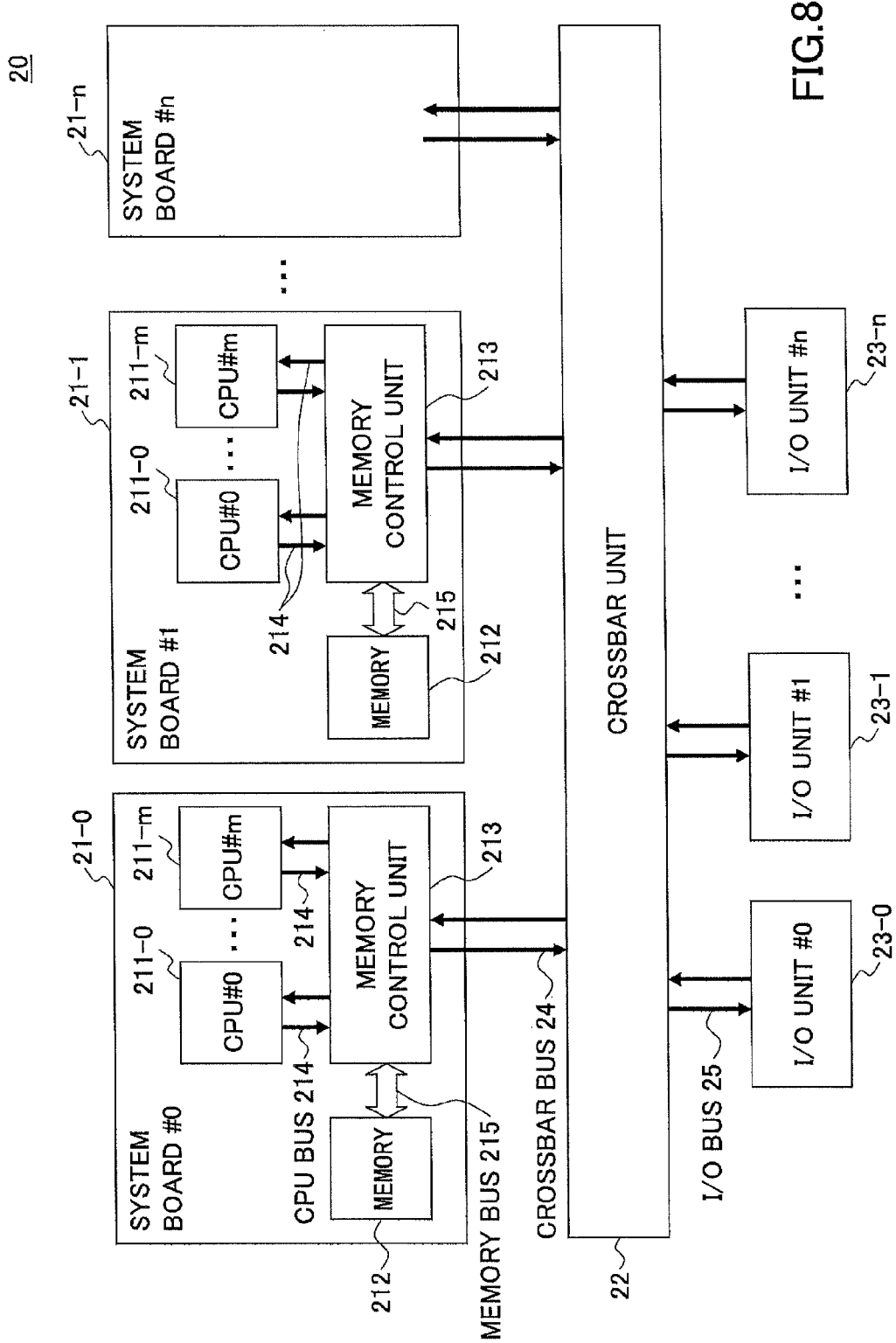
FIG. 8 is a block diagram illustrating an information processing apparatus that may be applied with a data transfer method, and a code conversion circuit and apparatus of the embodiment.

FIG. 8 is a block diagram illustrating an information processing apparatus that may be applied with the data transfer method, and the code conversion circuit and apparatus of the embodiment. An information processing apparatus 20 illustrated in FIG. 8 includes a plurality of system boards 21-0 through 21-n (n is a natural number greater than or equal to 1), a crossbar unit 22, a plurality of input and output (I/O) units 23-0 through 23-n, a crossbar bus 24, and an I/O bus 25. In the example illustrated in FIG. 8, each of the system boards 21-0 through 21-n has the same structure including a plurality of CPUs (Central Processing Units) 211-0 through 211-m (m is a natural number independent of n and greater than or equal to 1), a memory 212, a memory control unit 213, a CPU bus 214, and a memory bus 215. In each of the system boards 21-0 through 21-n, each of the CPUs 211-0 through 211-m is connected to the memory control unit 213 via the CPU bus 214, and the memory 212 is connected to the memory control unit 213 via the memory bus 215. Each of the system boards 21-0 through 21-n is connected to the crossbar unit 22 via the crossbar bus 24, and each of the I/O units 23-0 through 23-n is connected to the crossbar unit 22 via the I/O bus 25.

The data transfer between each of the CPUs 211-0 through 211-m and the memory control unit 213 is made between a code conversion circuit (not illustrated) within each of the CPUs 211-0 through 211-m and a code conversion circuit (not illustrated) within the memory control unit 213, via the CPU bus 214. In each of the system boards 21-0 through 21-n, the data transfer between the memory 212 and the memory control unit 213 is made between the memory 212 and the code conversion circuit (not illustrated) within the memory control unit 213, via the I/O bus 215. In each of the system boards 21-0 through 21-n, the data transfer between the memory control unit 213 and the crossbar unit 22 is made between the code conversion circuit (not illustrated) within the memory control unit 213 and a code conversion circuit (not illustrated) within the crossbar unit 22, via the crossbar bus 24. In addition, the data transfer between the crossbar unit 22 and each of the I/O units 23-0 through 23-n is made between the code conversion circuit (not illustrated) within the crossbar unit 22 and a code conversion circuit (not illustrated) within each of the I/O units 23-0 through 23-n, via the I/O bus 25.

Figure 9:
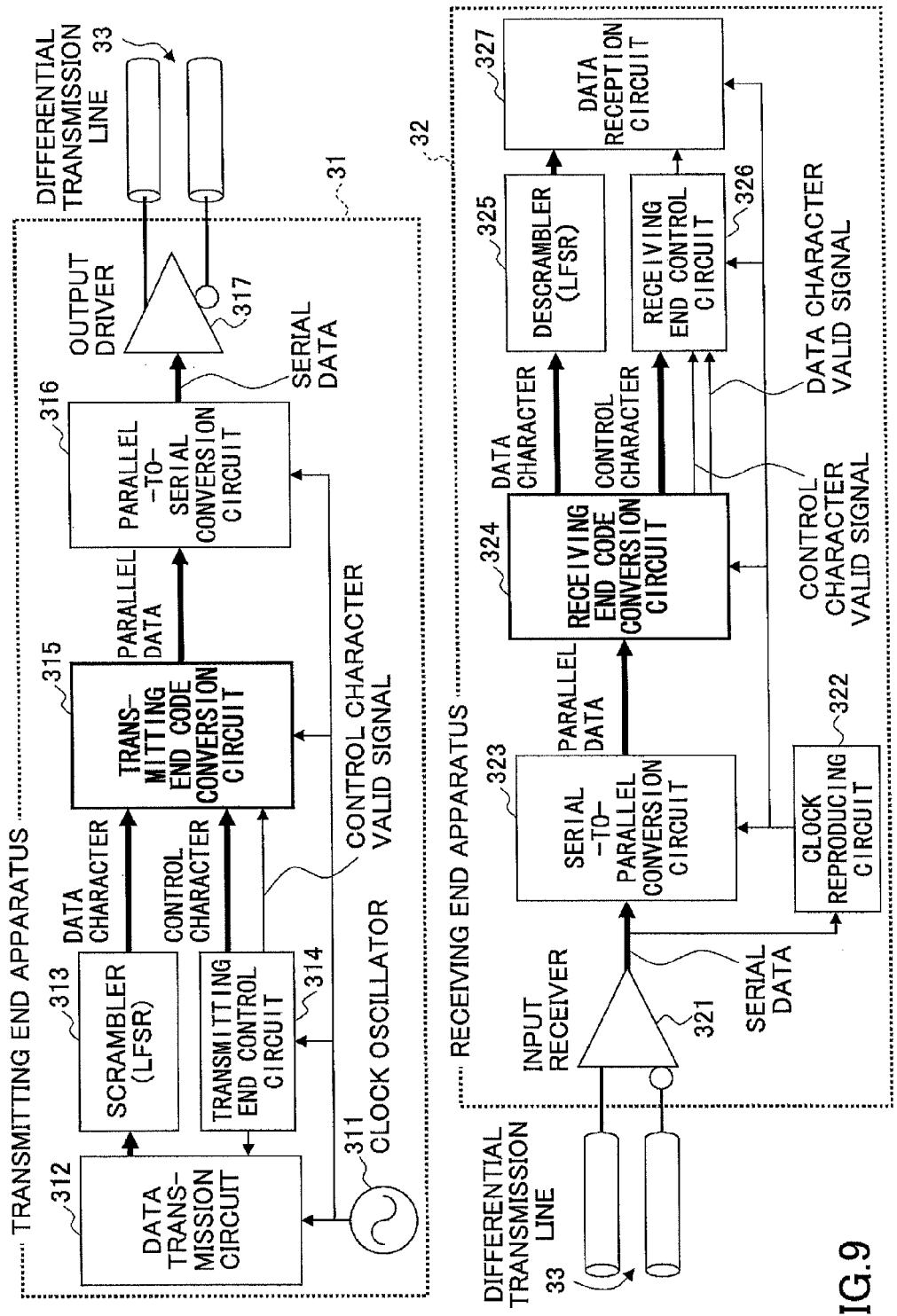
FIG. 9 is a block diagram illustrating the code conversion circuit within a transmitting end apparatus and the code conversion circuit within a receiving end apparatus.

FIG. 9 is a block diagram illustrating the code conversion circuit within the transmitting end apparatus and the code conversion circuit within the receiving end apparatus. The transmitting end apparatus and the receiving end apparatus are respectively provided within the CPUs 211-0 through 211-m, the memory control unit 213, the crossbar unit 22, and the I/O units 23-0 through 23-n. It is assumed for the sake of convenience that a transmitting end apparatus 31 is provided within the memory control unit 213 of the system board 21-0, and a receiving end apparatus 32 is provided within the crossbar unit 22. Hence, a differential transmission line 33, such as a printed circuit, connecting the transmitting end apparatus 31 and the receiving end apparatus 32, may formed by the crossbar bus 24 in this example.

As illustrated in FIG. 9, the transmitting end apparatus 31 includes a clock oscillator 311, a data transmission circuit 312, a scrambler 313 using LFSR (Linear Feedback Shift Register), a transmission end control circuit 314, a transmission end code conversion circuit 315, a parallel-to-serial conversion circuit 316, and an output driver 317. A clock output from the clock oscillator 311 is input to the data transmission circuit 312, the transmitting end control circuit 314, the transmitting end code conversion circuit 315, and the output parallel-to-serial conversion circuit 316. The data character from the scrambler 313, and the control character and the control character valid signal from the transmitting end control circuit 314 are input to the transmitting end code conversion circuit 315. An output of the transmitting end control circuit 314 is also input to the data transmission circuit 312. The parallel data output from the transmitting end code conversion circuit 315 is converted into serial data by the parallel-to-serial conversion circuit 316, and input to the output driver 317.

On the other hand, the receiving end apparatus 32 includes an input receiver 321, a clock reproducing circuit 322, a serial-to-parallel conversion circuit 323, a receiving end code conversion circuit 324, a descrambler 325 using a LFSR, a receiving end control circuit 324, and a data reception circuit 327. The clock reproducing circuit 322 reproduces the clock from the serial data output from the input receiver 321, and inputs the clock to the serial-to-parallel conversion circuit 323, the receiving end code conversion circuit 324, the receiving end control circuit 326, and the data reception circuit 327. The serial data output from the input receiver 321 is converted into parallel data by the serial-to-parallel conversion circuit 323, and input to the receiving end code conversion circuit 324. The data character output from the receiving end code conversion circuit 324 is input to the descrambler 325. The control character, the control character valid signal, and the data character valid signal output from the receiving end code conversion circuit 324 are input to the receiving end control circuit 326. Outputs of the descrambler 325 and the receiving end control circuit 326 are input to the data reception circuit 327

The data transmission circuit 312 and the data reception circuit 327 correspond to a data link layer of the PCI Express, for example. The scrambler 313 and the descrambler 325 are provided in order to reduce EMI (Electro Magnetic Interference) generated in the differential transmission line 33 by randomizing the transfer data, however, the scrambler 313 and the descrambler 325 may be omitted.

The transmitting end control circuit 314 controls the state of the entire transmitting end apparatus 31 including the transmitting end code conversion circuit 315. Similarly, the receiving end control circuit 326 controls the state of the entire receiving end apparatus 32 including the receiving end code conversion circuit 324. An example of a control operation of the control circuits 314 and 326 includes an initializing process. In the initializing process, a process using the control character called the K character is performed. When the initializing process is required, a K character instructing the initializing process is sent from the transmitting end apparatus 31 to the receiving end apparatus 32 in order to execute an initializing sequence. The K character is the control character required to perform the initializing sequence. The initializing process itself is known, and a detailed description of the initializing process will be omitted in this specification since an example of the initializing process is proposed in PCI Express Base Specification Revision 2.0, PCI-SIG, Dec. 20, 2006, for example.

The parallel-to-serial conversion circuit 316 of the transmitting end apparatus 31 converts the parallel data output from the transmitting end code conversion circuit 315 into the serial data. On the other hand, the serial-to-parallel conversion circuit 323 of the receiving end apparatus 32 converts the serial data received by the input receiver 321 into the parallel data, and inputs the parallel data to the receiving end code conversion circuit 324. The parallel-to-serial conversion circuit 316 and the serial-to-parallel conversion circuit 323 may be formed by a high-speed shift register, for example.

The output driver 317, the input receiver 321, and the differential transmission line 33 connecting the output driver 317 and the input receiver 321 form a circuit to transfer the serial data between the transmitting end apparatus 31 and the receiving end apparatus 32 (for example, between the LSIs). Because the circuit itself, configured to transfer the serial data, is known, a detailed description on the circuit that transfers the serial data will be omitted in this specification.

Next, a description will be given of the data transfer from the transmitting end apparatus 31 to the receiving end apparatus 32. The parallel data is output from the data transmission circuit 312 depending on a transmission line valid signal from the transmitting end control circuit 314. The parallel data is randomized in the scrambler 313 and is supplied to the transmitting end code conversion circuit 315 as the data character. When the transmitting end control circuit 314 outputs the control character, the transmitting end control circuit 314 supplies the control character valid signal together with the encoded control character to the transmitting end code conversion circuit 315.

The scrambler 313 is provided in order to scatter frequency components of the EMI and facilitate the EMI countermeasures. More particularly, when the D character to be transferred is a succession of a specific value, that is, consecutive "0"s or consecutive "1"s, for example, the EMI having specific frequency components may easily be generated in the transmission line in the case of the transmitting end apparatus having no scrambler. In general, such EMI may easily cause undesirable effects on other apparatuses. The scrambler 313 has the effect of suppressing generation of the EMI having the specific frequency components by performing a pseudo randomizing, even when the D character is a succession of the same value, and the scrambler 313 may be provided for this reason.

In the transmitting end code conversion circuit 315, the data character from the scrambler 313 and the control character and the control character valid signal from the transmitting end control circuit 314 are converted into the parallel data called the symbol code, and this symbol code is supplied to the parallel-to-serial conversion circuit 316. The parallel-to-serial conversion circuit 316 converts the parallel data into the serial data in synchronism with the clock (transmission clock) output from the clock oscillator 311, and outputs the serial data. The clock oscillator 311 may output a low-speed clock to control the transfer of the parallel data, in addition to the transmission clock, and supply the low-speed clock to various parts within the transmitting end apparatus 31. The low-speed clock has a speed, that is, a frequency, lower than that of the transmission clock.

The serial data output from the parallel-to-serial conversion circuit 316 is input to the receiving end apparatus 32 via the output driver 317 and the differential transmission line 33. The input receiver 321 outputs the received serial data to the clock reproducing circuit 322 and the serial-to-parallel conversion circuit 323. Although FIG. 9 illustrates an example using the differential transmission line 33, it is of course possible to use a transmission line other than the differential transmission line 33.

The clock reproducing circuit 322 includes a PLL (Phase Locked Loop) circuit, and reproduces a reception clock by detecting an edge of a bit transmission that exists at least once within the symbol data and synchronizing the PLL circuit to the edge. In order to reproduce the reception clock in this manner, the bit transition must exist within the symbol data. The technique used to reproduce the reception clock in this manner is called CDR (Clock Data Recovery) or EC (Embedded Clock), and this technique is generally used in high-speed serial transfer.

In the serial-to-parallel conversion circuit 323, the serial data from the input receiver 321 is converted into the symbol code (parallel data) based on the reproduced reception clock, and output to the receiving end code conversion circuit 324. The receiving end code conversion circuit 324 decodes the symbol code to detect the type (kind) of the symbol, and generates the data character or the control character and the valid signal thereof. In other words, the receiving end code conversion circuit 324 generates the data character and the data character valid signal or, generates the control character and the control character valid signal. The data character is output to the descrambler 325. The control character, the control character valid signal, and the data character valid signal are output to the receiving end control circuit 326.

When decoding the symbol code, an error detection signal may be obtained by detecting a specific error pattern called the symbol error. In this case, the error detection signal may be notified to the receiving end control circuit 326 together with the valid signal of the control character or the data character.

The descrambler 325 derandomizes the data character using LFSR, and outputs the data character to the data reception circuit 327. The receiving end control circuit 326 may perform processes respectively depending on the control character and the error signal, however, such processes themselves are not directly related to the subject matter of this embodiment, and thus a detailed description of such processes will be omitted in this specification.

This embodiment may define the K character in a manner similar to the conventional 8B10B encoding, and in the case illustrated in FIG. 7, a maximum of 16 kinds of K characters may be defined. For this reason, the control of the 8B10B encoding may be utilized for the control of the physical layer and the control of link layer such as DLLP. Accordingly, the control circuits 314 and 326 may be designed based on the control circuit used in the case of the 8B10B encoding.

Next, a more detailed description will be given of the operation the transmitting end code conversion circuit 315, by referring to FIGS. 10, 11 and 12. As an example, it is assumed for the sake of convenience that the bit width of the data character is 9 bits, the bit width of the control character is 4 bits, and the bit width of the symbol code is 10 bits. However, the bit widths of the data character, the control character, and the symbol code are of course not limited to such bit widths.

The transmitting end code conversion circuit 315 selects one of the data character and the control character and multiplexes the selected character with the control character valid signal, and embeds a specific bit pattern in the symbol code so that the data character and the control character are separable within the receiving end apparatus 32. The specific bit pattern guarantees the generation of the bit transmission for reproducing the clock.

Figure 10:
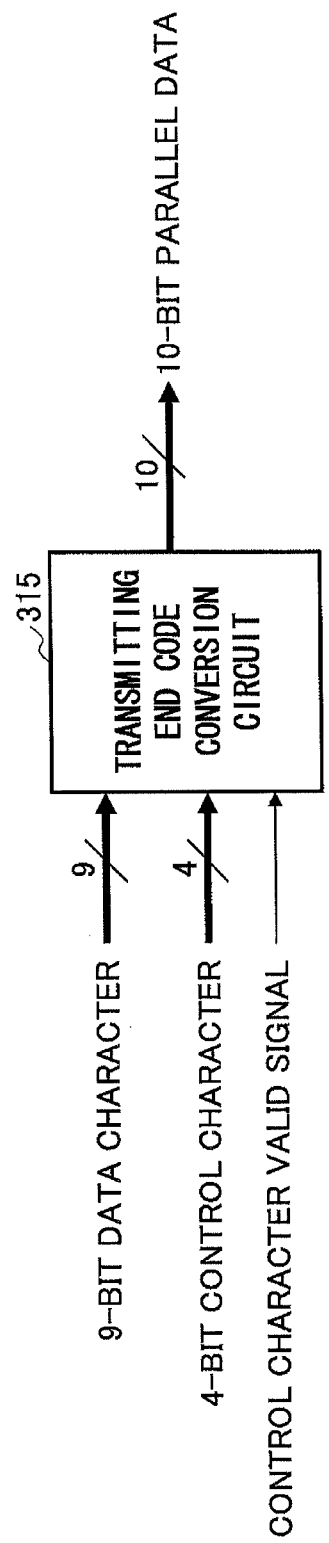
FIG. 10 is a diagram for explaining inputs and outputs of the transmitting end code conversion circuit.

FIG. 10 is a diagram for explaining inputs and outputs of the transmitting end code conversion circuit 315. The inputs of the transmitting end code conversion circuit 315 include the 9-bit data character, the 4-bit control character, and the control character valid signal. In addition, outputs of the transmitting end code conversion circuit 315 include the 10-bit parallel data. The 10-bit parallel data is input to the parallel-to-serial conversion circuit 316 as the symbol code.

Figure 11:
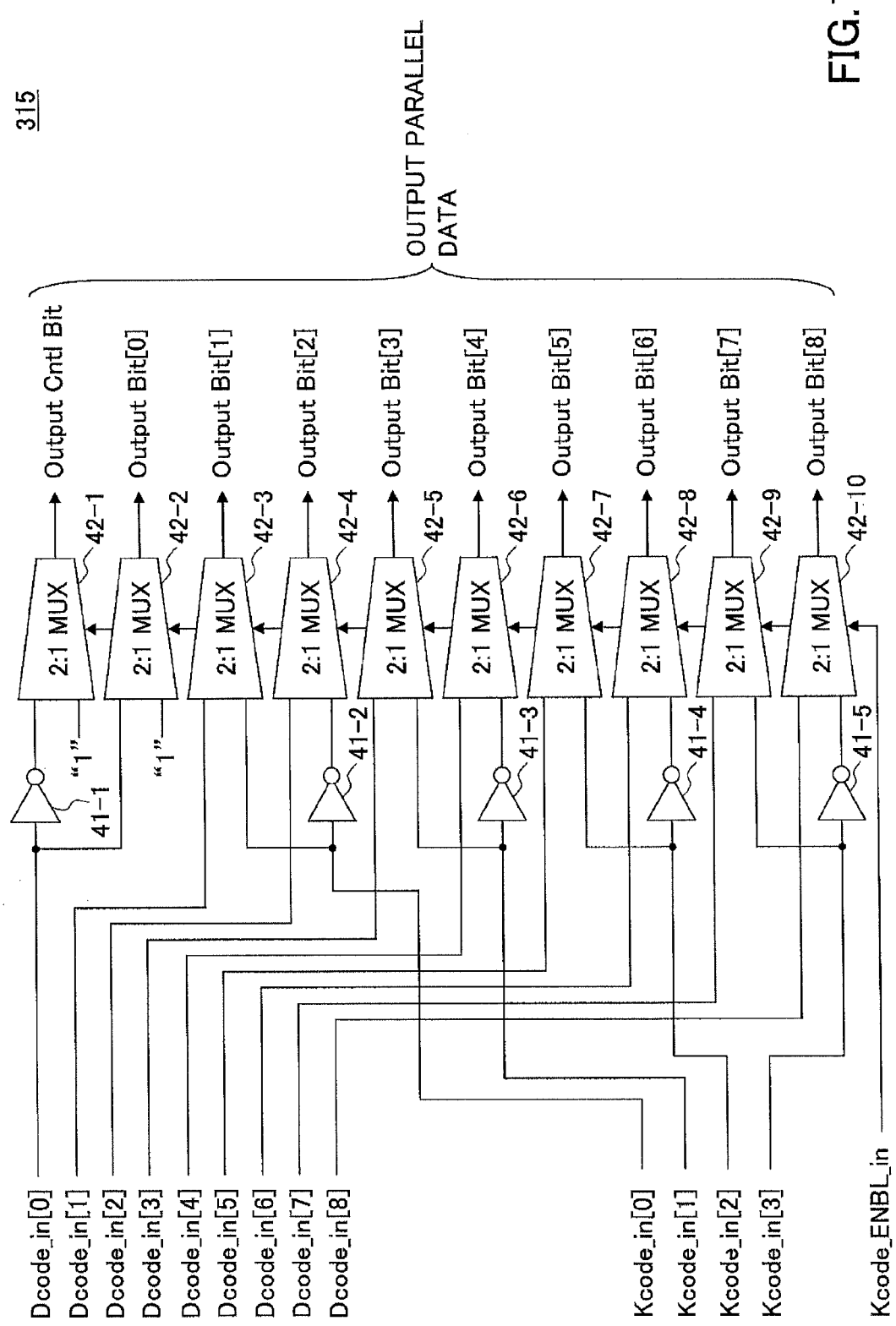
FIG. 11 is a circuit diagram illustrating an example of a structure of the transmitting end conversion circuit.

FIG. 11 is a circuit diagram illustrating an example of a structure of the transmitting end conversion circuit 315. The transmitting end code conversion circuit 315 includes inverter circuits 41-1 through 41-5, and 2:1 multiplexers (MUXs) 42-1 through 42-10 that are connected as illustrated in FIG. 11. In FIG. 11, Kcode_ENBL_in denotes the control character valid signal, and indicates that the control character is valid when a logically ON (for example, high level). In addition, Kcode_in[0:3] denotes the control character input, and Dcode_in[0:8] denotes the data character input. Further, Output Cntl Bit and Output Bit[0:8] denote the 10-bit symbol code output. Each of the multiplexers 42-1 through 42-10 selectively outputs the control character input Kcode_in when the control character valid signal Kcode_ENBL_in is ON, and selectively outputs the data character input Dcode_in when the control character valid signal Kcode_ENBL_in is OFF.

When the control character input Kcode_in is selectively output in the multiplexers 42-1 through 42-10, the bit Output Cntl Bit and the bit Output Bit[0] are output with the value "1". This value "1" notifies the receiving end that the symbol code output is the control character. In addition, the value of the control character input Kcode_in[0] is output to the bit Output Bit[1], and the value of the control character input Kcode_in[0] inverted by the inverter circuit 41-2 is output to the bit Output Bit[2]. Thereafter, the value of the control character input Kcode_in[1] is output to the bit Output Bit[3], and the value of the control character input Kcode_in[1] inverted by the inverter circuit 41-3 is output to the bit Output Bit[4]. The value of the control character input Kcode_in[2] is output to the bit Output Bit[5], and the value of the control character input Kcode_in[2] inverted by the inverter circuit 41-4 is output to the bit Output Bit[6]. The value of the control character input Kcode_in[3] is output to the bit Output Bit[7], and the value of the control character input Kcode_in[3] inverted by the inverter circuit 41-5 is output to the bit Output Bit[8].

In addition, when the data character input Dcode_in is selected in the multiplexers 42-1 through 42-10, the value of the data character input Dcode_in[0] inverted by the inverter circuit 41-1 is output to the bit Output Cntl Bit, and the value of the data character input Dcode_in[0] is output to the bit Output Bit[0]. The state in which these values, that is, the values of the Output Cntl Bit and Output Bit[0], do not match is the value notified to the receiving end to indicate that the symbol code output is the data character. In addition, the value of the data character input Dcode_in[1:8] is output to the bit Output Bit[1:8].

In this example, the value output to the Output Cntl Bit is the value of the data character input Dcode_in[0]. However, other data bits may be selected when an agreement is reached with the receiving end code conversion circuit 324.

FIG. 12 is a diagram illustrating a truth table for explaining an operation of the transmitting end code conversion circuit 315, and indicates the logical operation condition of the transmitting end code conversion circuit 315 illustrated in FIG. 11. In FIG. 12, ^Kcode_in[0] denotes the inverted value of Kcode_in[0], ^Kcode_in[1] denotes the inverted value of Kcode_in[1], ^Kcode_in[2] denotes the inverted value of Kcode_in[2], ^Kcode_in[3] denotes the inverted value of Kcode_in[3], and ^Dcode_in[0] denotes the inverted value of Dcode_in[0].

Accordingly, compared to the conventional method that uses the lookup table, the transmitting end code conversion circuit 315 may reduce the circuit scale and cost. In addition, the delay time of the circuit required for the conversion is a sum of the delay times of the inverter circuits and the 2:1 multiplexers (or selectors). Hence, compared to the conventional method, the delay time may be reduced considerably, and as a result, a high-speed conversion operation may be performed.

Next, a more detailed description will be given of the operation of the receiving end code conversion circuit 324, by referring to FIGS. 13, 14 and 15. As an example, it is assumed for the sake of convenience that the bit width of the data character is 9 bits, the bit width of the control character is 4 bits, and the bit width of the symbol code is 10 bits, as in the case of the transmitting end code conversion circuit 315 described above. However, as described above, the bit widths of the data character, the control character, and the symbol code are of course not limited to such bit widths. Of course, the bit widths of the data character, the control character, and the symbol code in the receiving end code conversion circuit 324 need to be the same as the bit widths of the data character, the control character, and the symbol code in the transmitting end code conversion circuit 315.

The receiving end code conversion circuit 324 detects the specific bit pattern embedded in the symbol code, and separates the data character and the control character that are multiplexed based on the specific bit pattern. The receiving end code conversion circuit 324 also detects a specific error pattern called the symbol error.

Figure 13:
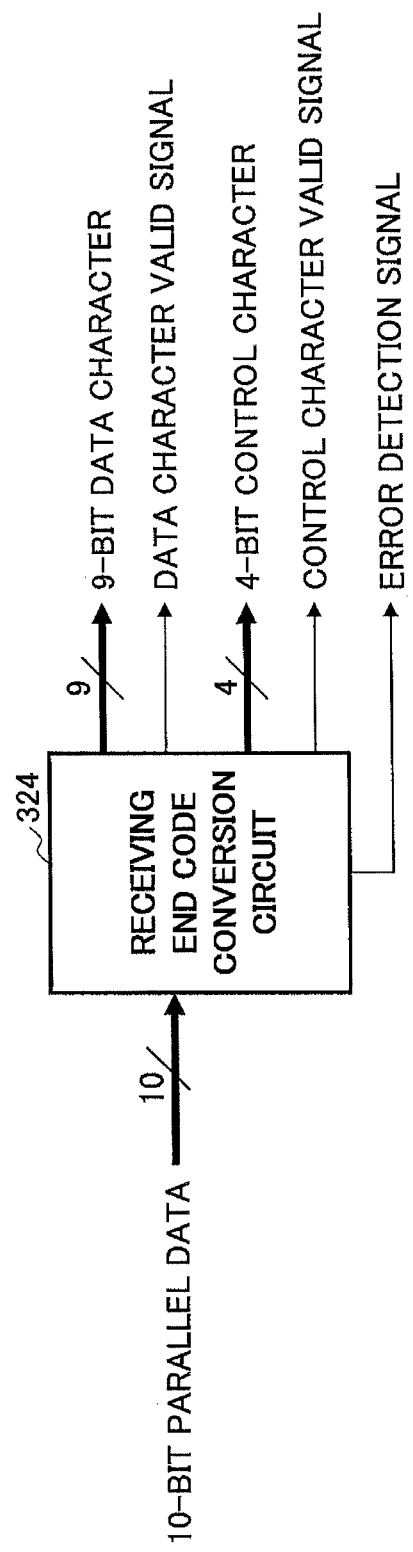
FIG. 13 is a diagram for explaining inputs and outputs of the receiving end code conversion circuit.

FIG. 13 is a diagram for explaining inputs and outputs of the receiving end code conversion circuit 324. An input of the receiving end code conversion circuit 324 includes the symbol code from the serial-to-parallel conversion circuit 323. Outputs from the receiving end code conversion circuit 324 include the data character having the bit width of 9 bits, the control character having the bit width of 4 bits, the data character valid signal, the control character valid signal, and the error detection signal that is obtained by detecting the symbol error.

Figure 14:
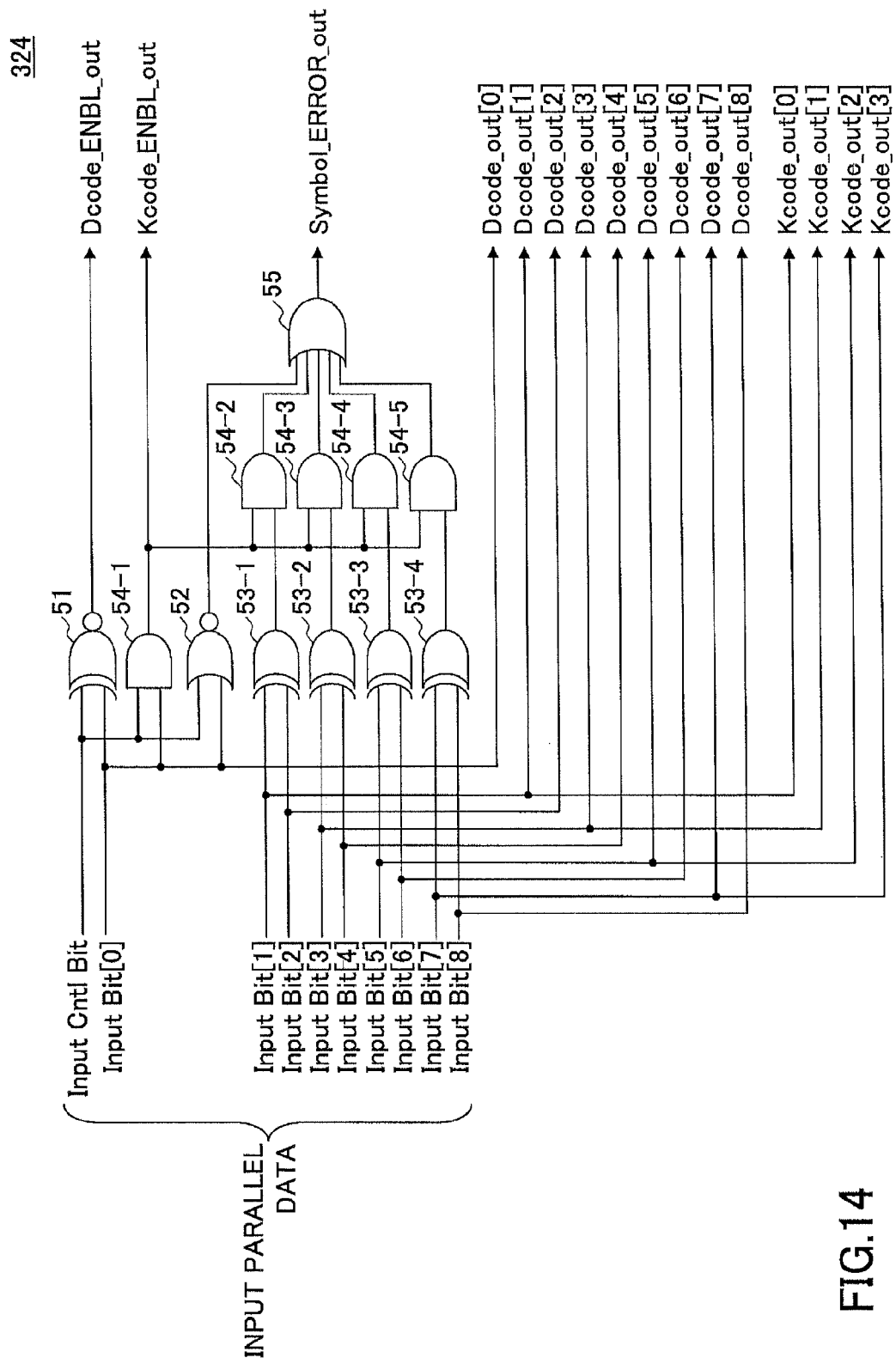
FIG. 14 is a circuit diagram illustrating an example of a structure of the receiving end code conversion circuit.

FIG. 14 is a circuit diagram illustrating an example of a structure of the receiving end code conversion circuit 324. The receiving end code conversion circuit 324 includes a Exclusive-NOR (ENOR) circuit 51, a NOR circuit 52, Exclusive-OR (EOR) circuits 53-1 through 53-4, AND circuits 54-1 through 54-5, and an OR circuit 55 that are connected as illustrated in FIG. 14. In FIG. 14, Input Cntl Bit and Input Bit[0:8] denote the symbol code input having the bit width amounting to a total of 10 bits, Dcode_out[0:8] denotes the data character output, and Kcode_out[0:3] denotes the control character output. In addition, Dcode_ENBL_out denotes the data character valid signal indicating that the data character output Dcode_out[0:8] is valid, Kcode_ENBL_out denotes the control character valid signal indicating that the control character output Kcode_out[0:3] is valid, and Symbol_ERROR_out denotes the error detection signal indicating that the received symbol code is other than a prescribed code. When the error detection signal is ON (for example, high level), all other output signals from the receiving end conversion circuit 324 are ignored in the receiving end control circuit 326.

In the receiving end code conversion circuit 324, the bit Input Cntl Bit and the bit Input Bit[0] of the symbol code input are decoded according to the definition of the symbol code. When the bit Input Cntl Bit and the bit Input Bit[0] do not match, this mismatch is detected by the ENOR circuit 51 in FIG. 14, and the data character valid signal Dcode_ENBL_out becomes ON. In addition, when the bit Input Cntl Bit and the bit Input Bit[0] both have the value "1", this state is detected by the AND circuit 54-1 in FIG. 14, and the control character valid signal Kcode_ENBL_out becomes ON. Otherwise, that is, when the bit Input Cntl Bit and the bit Input Bit[0] both have the value "0", the bit pattern indicates the symbol code error, and thus, the NOR circuit 52 in FIG. 14 detects this symbol code error and the error detection signal Symbol_ERROR_out output from the OR circuit 55 becomes ON. Furthermore, when the control character valid signal Kcode_ENBL_out is ON, that is, when the received symbol code is the control character, the EOR circuits 53-1 through 53-4 respectively detect whether a mismatch occurs between the bits Input Bit [1] and Input Bit [2], between the bits Input Bit [3] and Input Bit [4], between the bits Input Bit [5] and Input Bit [6], and between the bits Input Bit [7] and Input Bit [8]. When the mismatch is detected in one of the EOR circuits 53-1 through 53-4, there is a symbol code error, and thus, the error detection signal Symbol_ERROR_out that is output via the AND circuits 54-2 through 54-5 and the OR circuit 55 becomes ON.

The value of the bits Input Bit[0:8] of the symbol code input becomes the value of the bits Dcode_out[0:8] of the data character, as it is. The value of the bits Input Bit[1,3,5,7] of the symbol code input becomes the value of the bits Kcode_out [0:3] of the control character, as it is.

FIG. 15 is a diagram illustrating a truth table for explaining an operation of the receiving end code conversion circuit 324, and indicates the logical operation condition of the receiving end code conversion circuit 324 illustrated in FIG. 14.

Accordingly, compared to the conventional method that uses the lookup table, the receiving end code conversion circuit 324 may reduce the circuit scale and cost. In addition, the maximum delay time of the circuit required for the conversion is a sum of the delay times of the ENOR circuit, the NOR circuit, the EOR circuits, the AND circuits, and the OR circuit. Hence, compared to the conventional method, the delay time may be reduced considerably, and as a result, a high-speed conversion operation may be performed.

Figure 16:
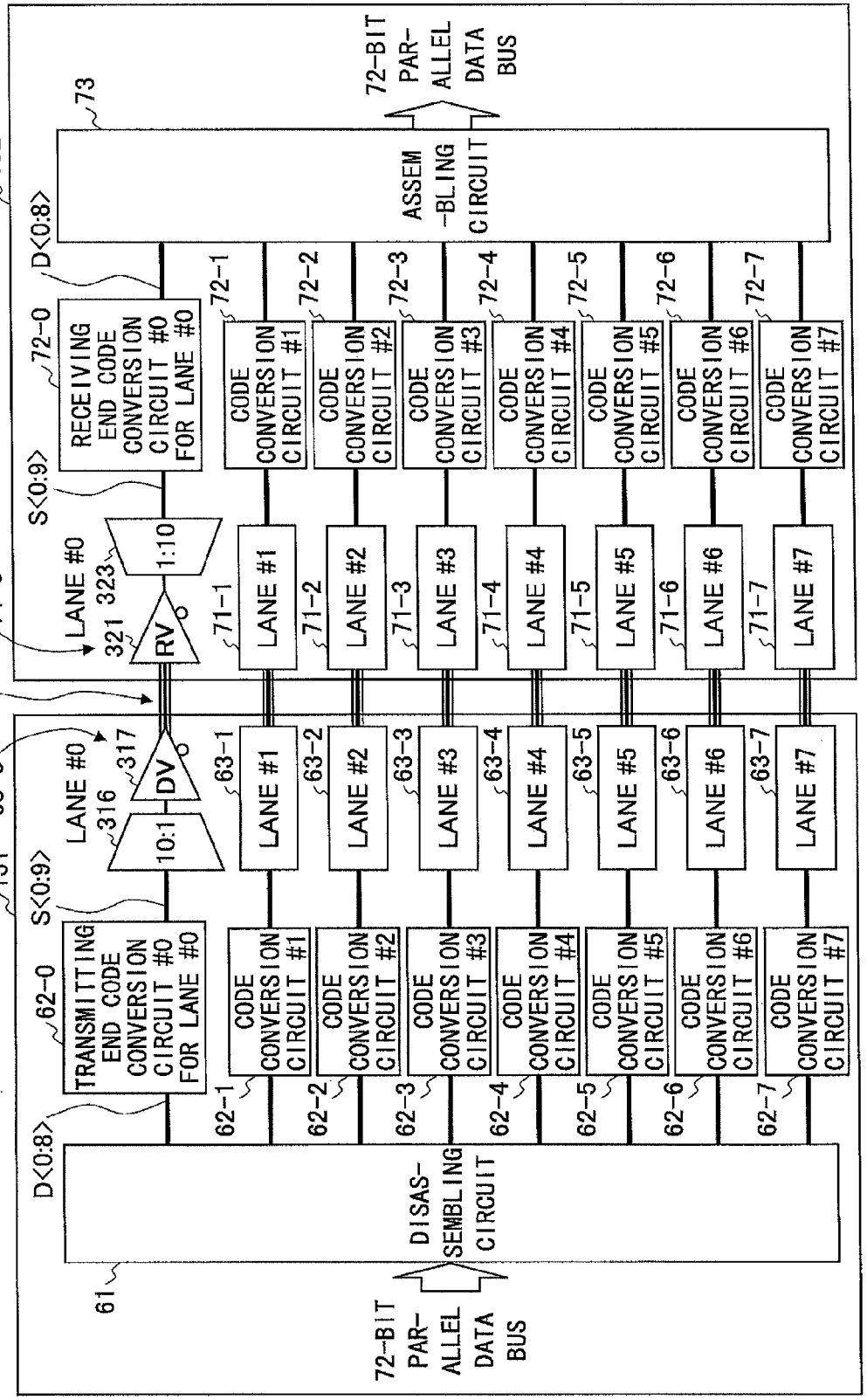
FIG. 16 is a block diagram illustrating the code conversion circuit within the transmitting end apparatus and the code conversion circuit within the receiving end apparatus in another embodiment of the present invention.

Next, a description will be given of another embodiment of the present invention, by referring to FIG. 16. FIG. 16 is a block diagram illustrating the code conversion circuit within the transmitting end apparatus and the code conversion circuit within the receiving end apparatus in this other embodiment of the present invention.

In a case in which the code conversion circuit is applied to a high-speed serial interface circuit and a bus performance with a higher band is required, a plurality of serial interfaces may be combined to form a single logical interface. According to the PCI Express specifications, the unit of such a single serial interface is referred to as a lane. In addition to the 1-lane structure, the PCI Express specifications also define 2-lane, 4-lane, 8-lane, 12-lane, 16-lane, and 32-lane structures. In the following description, the single serial interface will be referred to as 1-lane, as referred in a similar manner according to the PCI Express specifications.

FIG. 16 illustrates an example of a single logical interface in which 8 serial interface circuits including the code conversion circuit are combined. In other words, in FIG. 16, each of the transmitting end apparatus 131 and the receiving end apparatus 132 that are connected via the transmission line 133 has the 8-lane structure. The transmitting end apparatus 131 includes a byte-to-bit disassembling or separating circuit 61, a transmitting end code conversion circuits 62-0 through 62-7, and output parts 63-0 through 63-7. Each of lanes #0 through #7 within the transmitting end apparatus 131 has the same structure, and thus, only the structure of the lane #0 is illustrated. Each of the transmitting end code conversion circuits 62-0 through 62-7 has the same structure as the transmitting end code conversion circuit 315 illustrated in FIG. 9. On the other hand, the receiving end apparatus 132 includes input parts 71-0 through 71-7, receiving end code conversion circuits 72-0 through 72-7, and bit-to-byte assembling circuit 73. Each of lanes #0 through #7 within the receiving end apparatus 132 has the same structure, and thus, only the structure of the lane #0 is illustrated. The input part 71-0 includes an input receiver and a serial-to-parallel conversion circuit having the same structure as the input receiver 321 and the serial-to-parallel conversion circuit 323 illustrated in FIG. 9. Each of the receiving end code conversion circuits 72-0 through 72-7 has the same structure as the receiving end code conversion circuit 324 illustrated in FIG. 9. A transmitting end control circuit and a receiving end control circuit may have the same structure as the transmitting end control circuit 314 and the receiving end control circuit 326 illustrated in FIG. 9, and thus, the illustration and description of the control circuits in FIG. 16 will be omitted.

As described above in conjunction with the embodiment, the code conversion circuit converts the 9-bit data character into the 10-bit symbol code. For this reason, when viewed from the transmitting end apparatus 131, a 9-bit parallel data bus is provided for each lane, and thus, the transmission line 133 is formed by a 72-bit (=9 bits×8 lanes) parallel data bus in the case of the 8-lane structure.

On the other hand, in the case of the conventional serial interface having a 8B10B code conversion circuit, when the bandwidth of the transmission line is the same as that of this embodiment, that is, the symbol code length of 1 lane is 10 bits as in the case of this embodiment, a 8-bit parallel data bus is provided for each lane when viewed from the transmitting end apparatus. Hence in the case of the 8-lane structure, the transmission line in the case of the conventional serial interface is formed by a 64-bit (=8 bits×8 lanes) parallel data bus.

The disassembling circuit 51 and the assembling circuit 73 are required in the case of the serial interface circuit formed by a plurality of lanes. The disassembling circuit 51 has a function of receiving the 72-bit parallel data from a data transmitting apparatus (not illustrated), and supplying the parallel data to each lane for every 9 bits. In addition, the assembling circuit 73 has a function to perform a reverse operation of the disassembling circuit 51. That is, the assembling circuit 73 has a function of assembling the 9-bit parallel data from each of the lanes into the 72-bit parallel data, and transmitting the 72-bit parallel data to a data receiving apparatus (not illustrated).

FIG. 17 is a diagram for explaining an example of a bit allocation for each lane. FIG. 17 illustrates the bit definition of each bit of the 72-bit parallel data bus for each lane. In FIG. 17, the ordinate indicates the symbol code (bit width of 10 bits in this example) transferred in each lane, and the abscissa indicates each lane number, that is, each serial bus number. In addition, the bit 00 of the 72-bit parallel data bus is represented by D00 in FIG. 17. As an example, in the case of the lane number #0, the 1-bit control bit Cntl and the data bits D00 through D08 are combined to form a set of symbol code. In this example, a bit width of 72 bits may be secured as the effective data bus width. The 1-bit control bit Cntl needs to be defined in one set of symbol code, but an arbitrary bit of the 72-bit parallel data may be allocated to an arbitrary lane, and data bits other than those illustrated in FIG. 17 may be allocated to each lane.

FIG. 18 is a diagram for explaining an example of a bit allocation for the 72-bit parallel data bus. FIG. 18 illustrates the data definition of the 72-bit parallel data bus in the transmitting end apparatus 131 and the receiving end apparatus 132. For example, the bits Bit0 through Bit7 (Bit0~7) of the 72-bit parallel data bus may be defined as a data byte Byte0. The bits Bit64 through Bit71 (Bit64~71) of the 72-bit parallel data bus may be defined as redundant bits [0:8].

In an information processing apparatus having a high reliability, 8 redundant bits may be allocated with respect to the 8-byte data in general in order to improve the error resilience performance. The DIMM (Dual Inline Memory Module) is one example of improving the error resilience performance in this manner. In the DIMM having the bit width of 72 bits, 8 CBs (Check Bits) of an ECC (Error Correction Code) or the like may be allocated with respect to the 8-byte data, that is, the 64-bit data, in a manner similar to that illustrated in FIG. 18, in order to correct a 1-bit error, and to further enable detection of a 2-bit error, so that the error resilience performance is improved.

As described above, in the case of the conventional serial interface circuit having the 8B10B code conversion circuit, only the 64-bit parallel data bus may be realized even in the case of the 8-lane structure. Hence, when treating the 72-bit DIMM data to be input to the DIMM, for example, the redundant bits would need to be discarded or, the DIMM data would need to be converted into another format.

Moreover, in the conventional 8B10B code conversion circuit, the 1-bit error on the transmission line may become a 4-bit error at the maximum because the data character is converted into the symbol code using the lookup table. Generally, when the 8-bit CBs are allocated with respect to the 64-bit data, there is a high possibility that plural bit errors of 3 or more bits may not be detectable. Hence, when the 72-bit DIMM data is transferred to the conventional serial interface circuit and the 1-bit error occurs on the transmission line, this 1-bit error may change into unrecoverable multiple bit errors.

On the other hand, in the case of the serial interface circuit having the code conversion circuit of the embodiment described above, data having the bit width of 72 bits may be treated using the 8-lane structure. For this reason, the DIMM data may be output as it is to the serial bus interface bus, without having to convert the format of the DIMM data. In addition, the 1-bit error of the symbol code on the transmission line may be recognized as it is as a 1-bit error when the conversion is made to the D character, and the 1-bit error may be recoverable by the ECC to thereby improve the reliability.

The conventional 8B10B encoding converts the 8-bit data character into the 10-bit symbol in order to transmit the data character, and the overhead of the bus is 25%. On the other hand, according to each of the embodiments described above, the 9-bit data character is added with the 1-bit control bit and converted into the 10-bit symbol in order to transmit the data character, and thus, the overhead of the bus is 11%. In terms of the bandwidth of the transmission line, 20% of the band becomes the overhead in the case of the conventional 8B10B encoding, while 10% becomes the overhead in the case of each of the embodiments described above. Hence, the overhead in the case of each of the embodiments described above is reduced by 10% compared to the overhead of the conventional 8B10B encoding, and the effective utilization of the bus bandwidth may be realized.

In addition, according to each of the embodiments described above, the data character and the control character may be multiplexed and transmitted. In other words, the data character and 12 or more kinds of control characters may be multiplexed and transferred. As a result, each of the transmitting end apparatus and the receiving end apparatus may use a control circuit similar to the conventional control circuit.

Furthermore, each of the embodiments described above may provide a code conversion circuit having the AC characteristic required for the clock reproduction. In other words, at least one transition of the bit value (transition from "0" to "1" or, from "1" to "0") is included within one symbol (bit width of 10 bits in the described example). More particularly, when transmitting the data character, the bit Cntl Bit and the bit S_Bit0 of the symbol code always have values that are in an exclusive relationship, and in addition, when transmitting the control code, at least the bit S_Bit1 and the bit S_Bit2 always have values that are in an exclusive relationship. Accordingly, at least one bit transition is included within one symbol, and the clock may be reproduced in the receiving end apparatus using the transition timing of the bit value, in a manner similar to the conventional clock reproduction.

A maximum run length in the conventional case is 5 bits, but the maximum run length in each of the embodiments described above is 9 bits. The run length has an intimate relationship with the clock reproducing function, and it may be regarded that there are undesirable effects on the clock reproduction when the run length is extended.

With respect to such undesirable effects, an equalizer within the input receiver of the receiving end apparatus proposed in the Japanese Laid-Open Patent Publication No. 2007-32526 may be used, in order to stably reproduce the clock within the receiving end apparatus even when the run length is extended from 5 bits to 9 bits.

Moreover, according to each of the embodiments described above, each bit of the D character may be inverted and used or, used as it is as the bit of the symbol code. For this reason, it is unnecessary to use a lookup table which is used in the conventional case. Consequently, the circuit scale cost associated with the code conversion may be reduced, and further, the delay time associated with the code conversion may be reduced.

Conventionally, the 1-bit error on the transmission line may be recognized at the maximum as a 5-bit error of the data character, because the lookup table is used. On the other hand, each of the embodiments described above does not use the lookup table, and the data character may be assigned approximately with the format thereof to the symbol code. Thus, the 1-bit error generated on the transmission line may be recognized as it is in the receiving end apparatus as a 1-bit error of the data character. Compared to the 5-bit error recognized in the conventional case, the 1-bit error is recognized in each of the embodiments described above, to thereby enable the error correction to be performed more frequently to thereby improve the error resilience. In the case of the embodiments, at least one value "0" and at least one value "1" are always included within the symbol code, and for this reason, it may also be possible to detect burst error in which all bits are "0" (all "0"s) or all bits are "1" (all "1"s) on the transmission line.

Therefore, compared to the conventional 8B10B encoding, each of the embodiments described above may be regarded as providing a kind of a 9B10B encoding.

According to the disclosed data transfer method, and code conversion circuit and apparatus, it may be possible to reduce the overhead of the bus at the time of the serial transfer and effectively utilize the bandwidth of the bus.

Further, although the data transfer method, and the code conversion circuit and apparatus disclosed herein are described by way of embodiments, the present invention is not limited to these embodiments, and various variations and modifications may be made without departing from the scope of the present invention.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data transfer method comprising:
   multiplexing a data character having a bit width M and a control character having a bit width N, and adding a control character valid signal indicating whether the control character is valid, in order to generate a symbol code having a bit width M+1 or N+3, whichever is greater, where M is a natural number greater than or equal to 3, and N is a natural number greater than or equal to 1; and
   making a data transfer by converting the symbol code from parallel data into serial data, and outputting the serial data to a transmission line,
   wherein an inverted value of a predetermined bit of the data character is used as a value of the control character valid signal when transferring the data character, a value of the predetermined bit of the data character is used as the value of the control character when transferring the control character, and the control character is represented by bits other than the predetermined bit.

2. The data transfer method as claimed in claim 1, wherein M=9 and N=4,
   the control character valid signal has 1 bit, and
   a bit width of the symbol code is 10 bits.

3. The data transfer method as claimed in claim 1, further comprising:
   reproducing a clock from an edge of a bit transition existing within the serial data input from the transmission line;
   converting the serial data input from the transmission line into the parallel data based on the clock to output the symbol code; and
   detecting a type of a symbol by decoding the symbol code, and generating the data character or the control character, and a valid signal of the data character or the control character.

4. The data transfer method as claimed in claim 1, wherein the data character is formed by a D character of PCI Express, and the control character is formed by a K character of the PCI Express.

5. A code conversion circuit comprising:
   a first circuit configured to multiplex a data character having a bit width M and a control character having a bit width N, where M is a natural number greater than or equal to 3, and N is a natural number greater than or equal to 1; and
   a second circuit configured to add, to an output of the first circuit, a control character valid signal indicating whether the control character is valid, in order to generate a symbol code having a bit width M+1 or N+3, whichever is greater,
   wherein the symbol code is converted from parallel data into serial data and output to a transmission line,
   wherein the first circuit uses an inverted value of a predetermined bit of the data character as a value of the control character valid signal when transferring the data character, uses a value of the predetermined bit of the data character is used as the value of the control character when transferring the control character, and represents the control character by bits other than the predetermined bit.

6. The code conversion circuit as claimed in claim 5, wherein
M=9 and N=4,
the control character valid signal has 1 bit, and
a bit width of the symbol code is 10 bits.

7. The code conversion circuit as claimed in claim 5, wherein the data character is formed by a D character of PCI Express, and the control character is formed by a K character of the PCI Express.

8. An apparatus comprising:
a code conversion circuit including a first circuit configured to multiplex a data character having a bit width M and a control character having a bit width N, and a second circuit configured to add, to an output of the first circuit, a control character valid signal indicating whether the control character is valid, in order to generate a symbol code having a bit width M+1 or N+3, whichever is greater, where M is a natural number greater than or equal to 3, and N is a natural number greater than or equal to 1; and
a conversion circuit configured to convert the symbol code from parallel data into serial data and to output the serial data to a transmission line,
wherein the first circuit uses an inverted value of a predetermined bit of the data character as a value of the control character valid signal when transferring the data character, uses a value of the predetermined bit of the data character is used as the value of the control character when transferring the control character, and represents the control character by bits other than the predetermined bit.

9. The apparatus as claimed in claim 8, wherein
M=9 and N=4,
the control character valid signal has 1 bit, and
a bit width of the symbol code is 10 bits.

10. The apparatus as claimed in claim 8, wherein the data character is formed by a D character of PCI Express, and the control character is formed by a K character of the PCI Express.

* * * * *